US006772276B2

United States Patent
Dover

(10) Patent No.: US 6,772,276 B2
(45) Date of Patent: Aug. 3, 2004

(54) FLASH MEMORY COMMAND ABSTRACTION

(75) Inventor: Lance Dover, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 10/038,754

(22) Filed: Jan. 4, 2002

(65) Prior Publication Data

US 2003/0131185 A1 Jul. 10, 2003

(51) Int. Cl.[7] ............................................. G06F 12/00
(52) U.S. Cl. ................. 711/103; 711/154; 711/167; 711/163; 712/37; 712/205; 712/245; 712/248
(58) Field of Search ....................... 365/189.05, 189.08, 365/233; 711/103, 123, 125, 126, 129, 140, 154, 167, 170, 163; 712/37, 205, 226, 245, 248; 713/502, 600; 714/49, 55, 57

(56) References Cited

U.S. PATENT DOCUMENTS

| | | | | |
|---|---|---|---|---|
| 5,224,212 A | * | 6/1993 | Rosenthal et al. ............. 710/53 |
| 5,491,660 A | * | 2/1996 | Ashmore, Jr. ........... 365/230.02 |
| 5,537,627 A | * | 7/1996 | Dahlberg ..................... 712/248 |
| 5,546,561 A | | 8/1996 | Kynett et al. |
| 5,664,169 A | * | 9/1997 | Dahlberg ..................... 712/248 |
| 5,719,880 A | * | 2/1998 | Leung ......................... 714/733 |
| 5,905,902 A | | 5/1999 | O'Connor |
| 6,069,827 A | * | 5/2000 | Sinclair .................. 365/185.29 |
| 6,181,432 B1 | * | 1/2001 | Furuya ........................ 358/1.11 |
| 6,205,084 B1 | * | 3/2001 | Akaogi ........................ 365/233 |
| 6,385,688 B1 | * | 5/2002 | Mills et al. .................. 711/103 |
| 6,553,491 B1 | * | 4/2003 | Dover ......................... 713/100 |
| 2001/0049770 A1 | * | 12/2001 | Cai et al. ..................... 711/129 |

FOREIGN PATENT DOCUMENTS

| EP | 1 164 594 | 12/2001 |
|---|---|---|
| WO | WO02/067268 | 8/2002 |

OTHER PUBLICATIONS

Baker, A., et al., 3.3V 16Mb flash memory with advanced write automation:, *Proceedings of the 1994 IEEE International Solid-State Circuits Conference*, XP002237839, pp. 146–147, Feb. 1994.

* cited by examiner

*Primary Examiner*—Donald Sparks
*Assistant Examiner*—Christian P. Chace
(74) *Attorney, Agent, or Firm*—Rita M. Wisor

(57) ABSTRACT

Flash memory device capable of interpreting a write cycle and one or more subsequent write cycles as a generic command that includes one or more specific flash memory commands. The flash memory device includes a state machine capable of identifying the generic command, writing the specific flash memory commands to a buffer, and sequentially retrieving, interpreting and executing the buffered flash memory commands. The state machine can be configured as a microcontroller executing a state machine algorithm, and can be reprogrammed to correct design errors or to add new functionality to the flash memory device. The state machine algorithm can be stored in the flash memory device, and updated to interpret the same write cycle data in different ways. Accordingly, new functionality can be developed for the state machine long after its silicon has been designed and developed.

18 Claims, 3 Drawing Sheets

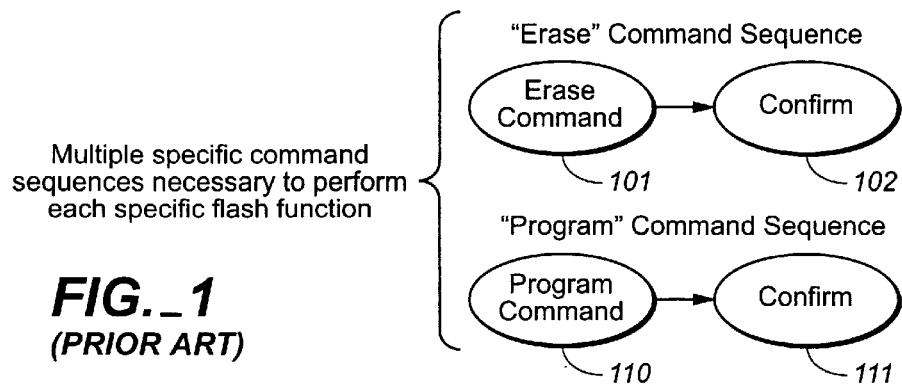
Multiple specific command sequences necessary to perform each specific flash function
FIG._1
(PRIOR ART)
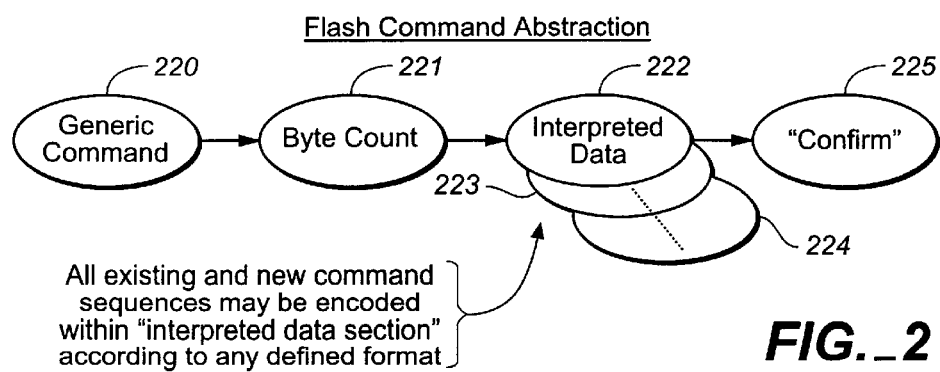
FIG._2

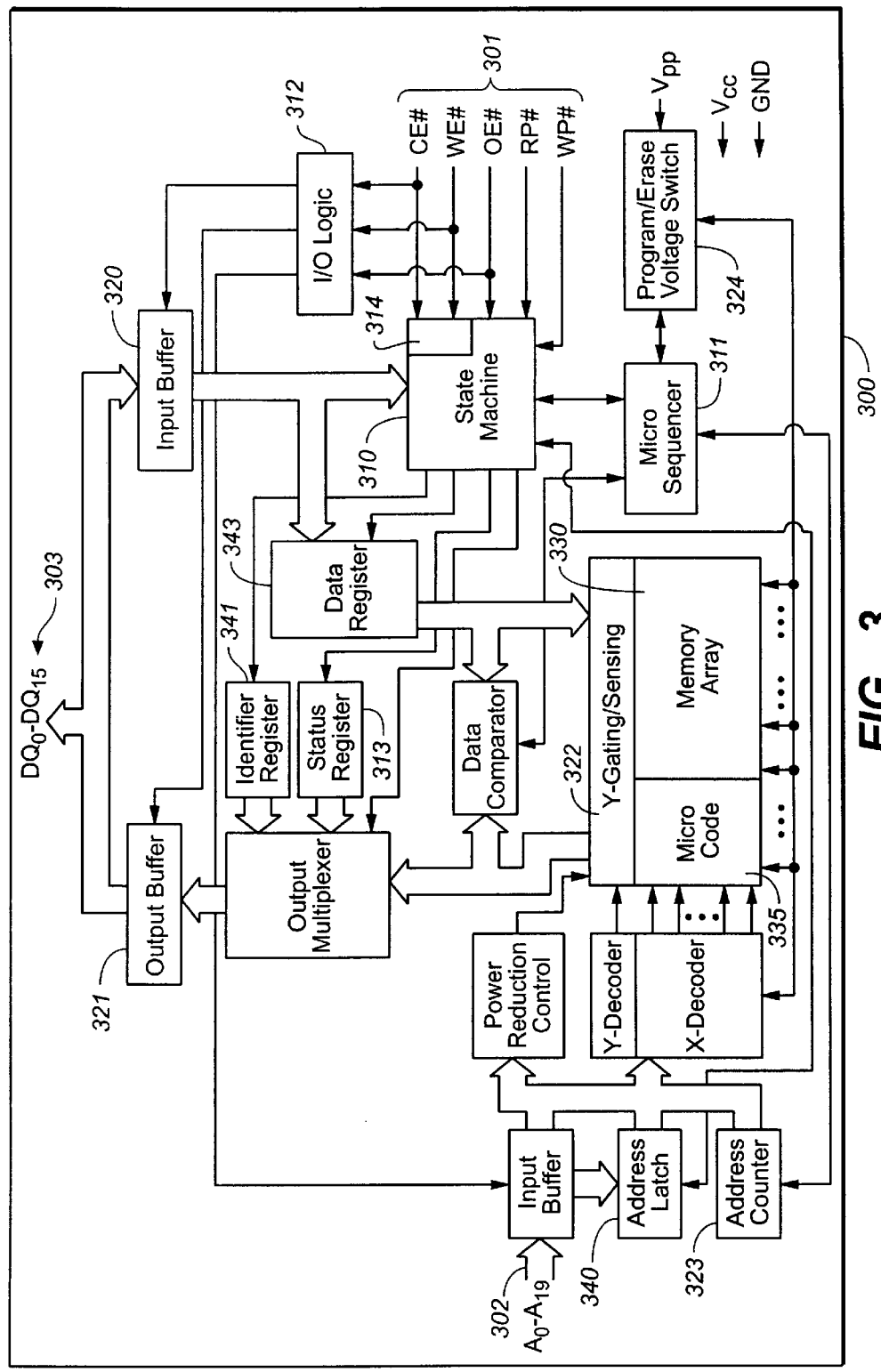
FIG._3

FLASH MEMORY COMMAND ABSTRACTION

BACKGROUND

This invention relates to flash memory devices and methods and apparatus for commanding and controlling flash memory devices.

Flash memory devices are solid state non-volatile memory devices that allow users to electrically program and erase information. Flash memory devices typically support both read and write cycles that respectively allow data to be read from and programmed into the flash memory. In the earliest flash memory devices, data and address buses internal to the flash memory had to be carefully controlled by a CPU or other external processor to perform even the simplest of tasks such as writing data to or reading data from a flash memory cell. As flash memory devices have matured, external processors have been relieved of this burden by incorporating state machines into the flash memory devices.

A state machine is a logical device whose current state or status is determined by its previous state or status. Each command received by a state machine determines not only what action the state machine will take (depending upon its current state), but also determines the next logical state the state machine will occupy. State machines can be implemented as hard-wired logic devices, or as microcontrollers configured to execute a state machine algorithm.

The incorporation of state machines into flash memory devices has allowed flash memory devices to autonomously perform simple tasks like programming and erasing data without external processor control. As a result, an external processor can issue a high level command to a flash memory device, and the state machine within the device can autonomously interpret the command, and perform the tasks that are necessary to execute the command. As the state machine performs these tasks, it can set bits in a status register that can be monitored by the external processor to determine the command's execution status.

Currently, state machines incorporated into flash memory devices are hard-wired by device design to autonomously interpret predetermined write cycles as commands, and to execute hard-wired or predetermined algorithms to fulfill those commands. As a result, currently available flash memory devices are only capable of interpreting the limited number of predetermined commands that have been logically designed into their state machines. As new features requiring new commands are developed for flash memory devices, new state machines must be specifically designed and developed to interpret and execute the new commands. Developing new state machines whenever new commands are developed for flash memory devices is a time-consuming process that is both inflexible and subject to logical design errors.

DESCRIPTION OF DRAWINGS

FIG. 1 is a diagram illustrating a prior art method for issuing and interpreting flash memory commands.

FIG. 2 is a diagram illustrating a flash memory command abstraction method for interpreting flash memory commands.

FIG. 3 is a schematic illustration of a flash memory device capable of interpreting commands using the flash memory command abstraction method.

Like reference symbols in the various drawings indicate like elements.

DETAILED DESCRIPTION

Figure 4:
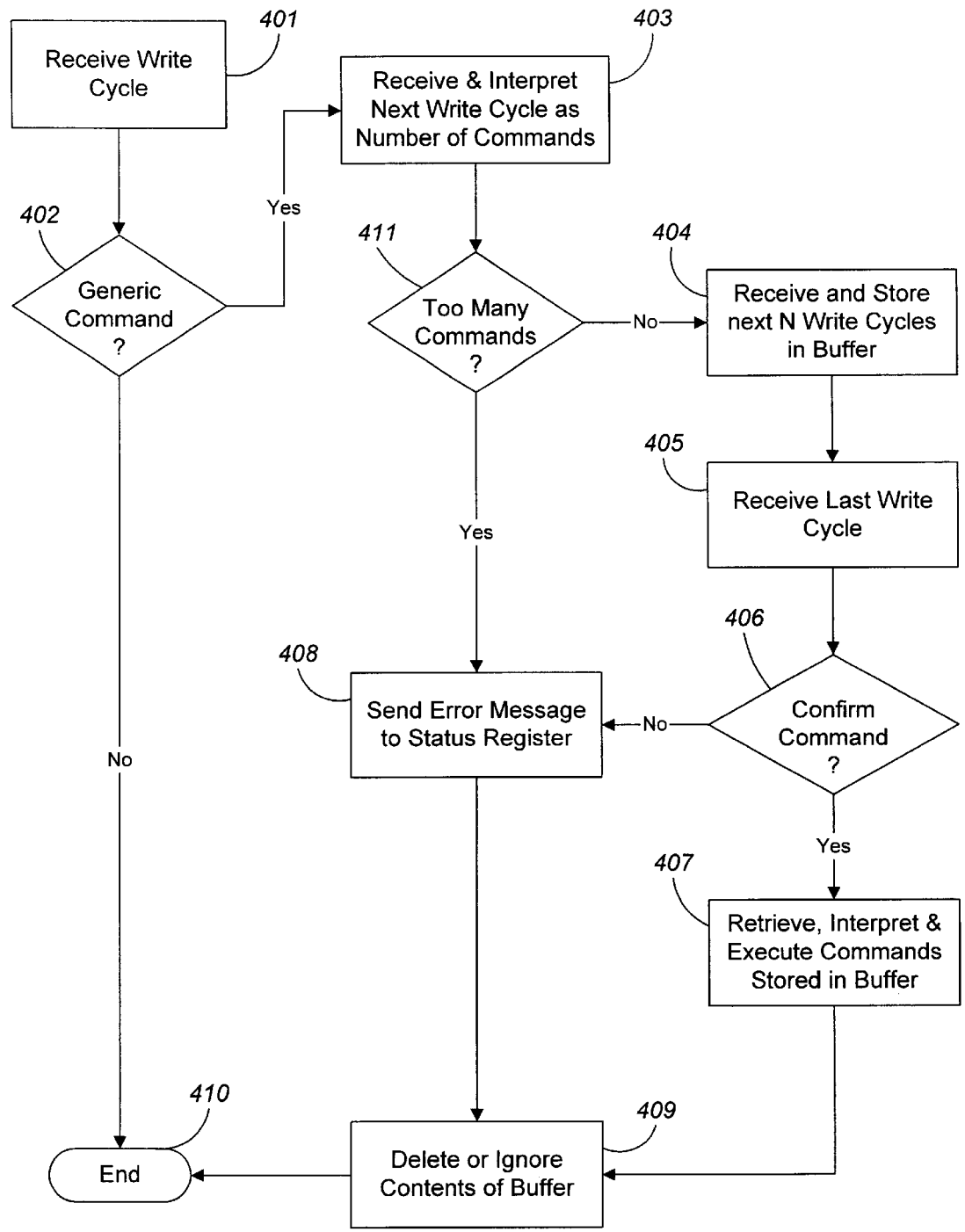
FIG. 4 is a flow chart illustrating a method for interpreting an abstract flash memory command.

FIG. 1 is a graphical illustration depicting a prior art method by which an external processor can issue commands to a prior art flash memory device. As previously explained, the prior art flash memory device contains a state machine that is hard-wired to receive and interpret certain predetermined write cycles from the external processor as commands. When the state machine receives and interprets a predetermined write cycle as a command, it traverses a hard-wired algorithm to perform various sub-tasks that are necessary to execute the command. Performance of these sub-tasks often requires the execution of primitive functions within the flash memory device such as latching and releasing specific address or data lines. These primitive functions can be performed by the state machine itself if the state machine is implemented as a hard-wired logic device, or can be performed by an embedded microsequencer attached to and controlled by the state machine. The embedded microsequencer is configured to execute predetermined and internally stored microcode to perform the primitive functions that are necessary to execute the external processor's predetermined commands.

FIG. 1 shows an example of the prior art method by which predetermined write cycles are interpreted as commands by a prior art state machine. As shown in the figure, an external processor can erase data from the prior art flash memory device by writing an erase command sequence to the flash memory device. The erase command sequence consists of a first predetermined write cycle that is interpreted as an erase set-up command 101, followed by a second predetermined write cycle that is interpreted as an erase confirm command 102. Similarly, the external processor can program data into the flash memory device by writing a program command sequence to the flash memory device. The program command sequence consists of a third predetermined write cycle that is interpreted as a program set-up command 110, followed by a fourth predetermined write cycle that is interpreted as a program confirm command 111.

FIG. 2 is a graphical illustration disclosing an improved method by which flash memory device commands can be issued to and interpreted by a flash memory device in one or more write cycles. An improved flash memory device, such as flash memory device 300 shown in FIG. 3, can be configured to receive and interpret a write cycle from an external processor as a generic command 220. The generic command 220 can be followed by one or more subsequent write cycles containing data to be interpreted by the flash memory device 300 as one or more specific flash memory commands. In particular, the write cycle for the generic command 220 can be followed by: a write cycle that can be interpreted as the number or byte count 221 of write cycles to follow; one or more write cycles that can be interpreted as specific flash memory commands 222–224 embedded within the generic command 220; and a write cycle that can be interpreted as a confirmation command 225. The confirmation command 225 can be used to verify the transfer of the specific flash memory commands 222–224, and to initiate the interpretation and execution of the specific flash memory commands 222–224. Specific flash memory commands 222–224 can include command instructions or sequences such as erase commands or program commands, as well as any data associated with the command instructions or sequences such as address data or raw data to be stored in the flash memory device 300.

Referring to FIGS. 3 and 4, flash memory device 300 is a device having a state machine 310 that can be configured to receive a write cycle from an external processor or controller (step 401), and interpret the write cycle as the generic command 220 disclosed in FIG. 2 (step 402). Upon identifying generic command 220, state machine 310 can be configured to receive a second write cycle, and interpret the second write cycle as a byte count 221 (see FIG. 2) that indicates the number N of subsequent write cycles that are to be stored in a buffer 314 (step 403). State machine 310 can be configured to check the byte count or number N of write cycles to be stored in buffer 314 (step 411), and can send an error message to status register 313 if the byte count is larger than the buffer 314 (step 408). If the byte count is smaller than buffer 314, state machine 310 can be further configured to receive and store in buffer 314 the next N write cycles from the external processor (step 404). Finally, state machine 310 can be configured to receive a final write cycle from the external processor (step 405).

If state machine 310 interprets the final write cycle as the confirmation command 225 (see FIG. 2; step 406), state machine 310 can be configured to sequentially retrieve, interpret, and execute the data stored in buffer 314 as specific flash memory commands 222–224 (step 407). As before, flash memory commands 222–224 can be interpreted as command instructions such as erase or program instructions, and data associated with the command instructions such as address data and raw data. However, if state machine 310 does not interpret the final write cycle as the confirmation command 225 (step 406), state machine 310 can be configured to write an error message to a status register 313 (step 408), and to erase or ignore the contents of buffer 314 (step 409).

Flash memory device 300 includes a plurality of control lines 301, address lines 302, and data lines 303 that allow the flash memory device 300 to communicate and share data with an external device controller or processor (not shown). The external processor or controller can issue commands to the flash memory device 300 in the form of write cycles that are interpreted by state machine 310 as commands, and can monitor the status of issued commands in the status register 313.

Data flow between the external processor and the flash memory device 300 can be controlled via the input/output ("I/O") control logic 312. I/O control logic 312 is controlled by control lines 301, and can be configured to selectably connect an input buffer 320 or an output buffer 321 to the external processor through device data lines 303. Depending on the state of control lines 301, I/O control logic 312 either allows input buffer 320 to latch data from data lines 303, or asserts data from output buffer 321 on data lines 303.

State machine 310 is also controlled, in part, by control lines 301. In certain control states, state machine 310 can be configured to receive write cycles from the external processor through input buffer 320, and to interpret the write cycles as commands. The interpreted commands can be specific flash memory command instructions such as erase and program commands, or can be the generic command 220 disclosed in FIG. 2. In any event, the received write cycles and interpreted commands can include raw data that is to be ultimately written to the flash memory array 330. In addition to receiving write cycles from input buffer 320, in certain states state machine 310 can be configured to receive address data from address latch 340.

State machine 310 is configured by its state machine algorithm to interpret write cycles received from the external processor as commands, and to execute the commands. The state machine algorithm allows the state machine 310 to autonomously perform various tasks that are necessary to execute the external processor's commands. This frees the external processor from the burden of having to control device specific tasks that are internal to the flash memory device 300. For example, the state machine algorithm can free the external processor from having to perform or oversee various bus operations that are internal to flash memory device 300, and that are necessary to execute the external processor's commands.

State machine 310 can be implemented as a hard-wired logic device configured to interpret predetermined write cycles from an external processor as flash memory commands. The hard-wired logic device can be further configured to process the interpreted commands. Alternatively, the hard-wired logic device can be operatively coupled to a microsequencer, and configured to signal the microsequencer to process the interpreted commands. In one embodiment, state machine 310 is configured as a logic device that is operatively coupled to a microsequencer 311. In this embodiment, state machine 310 can signal microsequencer 311 to fetch and execute predetermined sources of microcode to process write cycles that have been interpreted as commands by state machine 310. The predetermined sources of microcode can be stored in non-volatile memory within flash memory device 300. The non-volatile memory can be a part of flash memory array 330, or a standalone and dedicated microcode flash memory array 335. In one embodiment, the non-volatile memory is a dedicated microcode flash memory array 335.

State machine 310, in combination with microsequencer 311 and the microcode stored in microcode memory array 335, can autonomously perform the various primitive operations that are necessary to process a command from the external processor. Examples of such primitive operations include, but are not limited to, writing data from input buffer 320 to a data register 343, writing data to and receiving data from address latch 340, incrementing an address counter 323, writing data from data register 343 to an addressed cell of flash memory array 330, reading data from an addressed cell of flash memory array 330 to output buffer 321, and writing data from status register 313 to output buffer 321.

State machine 310, in combination with microsequencer 311 and the microcode stored in microcode memory array 335, can read data from and write data to various components of flash memory device 300 while in various states or stages of its internal algorithm. For example, in some states, state machine 310 can signal microsequencer 311 to write the data latched by input buffer 320 to either buffer 314 or data register 343. From data register 343, state machine 310 can signal microsequencer 311 to write the data to a sense amplifier 322 selectably connected to an addressed cell in flash memory array 330. State machine 310 can also signal microsequencer 311 to write data to and receive data from an address counter 323 or the status register 313. To program or erase data, in some states state machine 310 can signal microsequencer 311 to toggle a program/erase switch 324 in the on or off position. Similarly, in some states, state machine 310 can signal microsequencer 311 to write data from either the status register 313, the state identifier register 341, or the currently addressed element of flash memory array 330 to the output buffer 321. Data latched by output buffer 321 can subsequently be read by an external processor via data lines 303.

As disclosed in reference to FIG. 2, several advantages over the prior art can be achieved by designing state machine 310 to interpret a write cycle as a generic command 220, and to store and later interpret the data from subsequent write cycles as a plurality of specific flash memory commands 222–224. In particular, any prior art flash memory device functions that require an external processor to issue two or more separate commands in a specific command sequence (e.g., the erase command sequence and the program command sequence shown in FIG. 1) can be combined into a single generic command 220 that can be issued by the external processor. Data from the subsequent write cycles can then be written to the buffer 314, and interpreted and executed as specific flash memory commands such as erase and erase confirm commands by the state machine 310.

To add this functionality to flash memory device 300, flash memory device 300 includes a buffer 314 configured to hold specific flash memory commands, and microcode that allows state machine 310 and microsequencer 311 to: interpret a first write cycle as generic command 220; interpret a second write cycle as a number of subsequent write cycles to store in buffer 314; store subsequent write cycles to buffer 314; and sequentially retrieve, interpret, and execute the write cycles stored in buffer 314 as specific flash memory commands. Buffer 314 can be any type of memory that is capable of storing data, and can be the flash memory array 330 itself. In one embodiment, buffer 314 is a random access memory within state machine 310. The microcode to interpret a write cycle as a generic command 220, and to store, retrieve, interpret, and execute subsequent write cycles as specific flash memory commands can be stored in a microcode memory array 335.

State machine 310 and microsequencer 311 can be hard-wired to execute a predetermined state machine algorithm, or can be flexibly configured as a microcontroller designed to execute an associated state machine program. When state machine 310 and microsequencer 311 are hard-wired, they always interpret a given or predetermined write cycle as the same flash memory command.

Further advantages of the invention can be achieved by implementing state machine 310 and microsequencer 311 as a microcontroller configured to execute a state machine program. In particular, since the state machine program can itself be stored in the microcode memory array 335, implementing state machine 310 and microsequencer 311 as a microcontroller allows the state machine 310 and microsequencer 311 to be augmented or changed as design errors in the flash memory device 300 become apparent, or as new functionality is developed for the flash memory device 300. This aspect of the invention allows new functionality to be developed for the state machine 310 and microsequencer 311 long after silicon for the flash memory device 300 has been designed and developed, without significantly adding to the time or cost of designing the flash memory device 300.

When state machine 310 and microsequencer 311 are implemented as a microcontroller configured to execute a state machine program, state machine 310 can be programmed to interpret a given or predetermined write cycle from the external processor as any of a number of flash memory commands, depending on the current state machine program loaded into microcode memory array 335. The flash memory command that is interpreted from a predetermined write cycle is said to be programmably updateable according to the state machine program stored in microcode memory array 335.

A number of embodiments of the invention have been described. Nevertheless, it will be understood that various modifications may be made without departing from the spirit and scope of the invention.

What is claimed is:

1. A flash memory device, comprising:
   a buffer configured to store specific flash memory commands or data written to the flash memory device in one or more write cycles;
   a state machine coupled to the buffer and configured to interpret a first write cycle as a generic command, wherein the generic command includes an interpreted data section containing one or more specific flash memory commands, and to store data from one or more subsequent write cycles in the buffer as a sequence of one or more specific flash memory commands, the state machine further configured to sequentially execute the data in the buffer as one or more specific flash memory commands upon interpreting a final write cycle as a confirmation command; and
   a flash memory array operatively coupled to the state machine, and configured to store and retrieve raw data as indicated in the one or more specific flash memory commands.

2. The device of claim 1, further comprising:
   a non-volatile memory; and
   a microsequencer operatively coupled to the state machine, and configured to fetch and execute microcode stored in the non-volatile memory responsive to signals received from the state machine.

3. The device of claim 2, wherein the non-volatile memory is the flash memory array.

4. The device of claim 2, wherein the state machine and microsequencer are hard-wired to always interpret a predetermined write cycle as the same flash memory command.

5. The device of claim 2, wherein the state machine and microsequencer are configured as a microcontroller configured to execute a state machine program.

6. The device of claim 5, wherein the state machine program is stored in the non-volatile memory.

7. The device of claim 6, wherein the state machine program is updateable, and the state machine is configured to interpret a predetermined write cycle as a programmably updateable flash memory command.

8. A method for flash memory command abstraction, comprising:
   interpreting data received in a first write cycle as a generic flash memory command, wherein the generic command includes an interpreted data section containing one or more specific flash memory commands;
   interpreting data received in a second write cycle as a number N of subsequent write cycles to be stored as a sequence of specific flash memory commands;
   receiving and storing the N subsequent write cycles in a buffer; and
   executing the N specific flash memory commands stored in the buffer upon receiving a final write cycle that can be interpreted as a confirmation command.

9. The method of claim 8, further comprising outputting an error message and erasing the N specific flash memory commands stored in the buffer upon receiving a final write cycle that cannot be interpreted as a confirmation command.

10. The method of claim 8, further comprising outputting an error message and ignoring the N specific flash memory commands stored in the buffer upon receiving a final write cycle that cannot be interpreted as a confirmation command.

11. The method of claim 8, further comprising outputting an error message when the number of write cycles N interpreted from the second write cycle is larger than the number of flash memory commands that can be stored in the buffer.

12. The method of claim 8, further comprising using a microcontroller executing a state machine program to interpret a write cycle as a programmably updateable flash memory command according to the currently loaded state machine program.

13. A computer program product, implemented on a machine readable medium, the computer program product comprising instructions operable to cause a programmable microcontroller to:

interpret data received in a first write cycle as a generic flash memory command, wherein the generic command includes an interpreted data section containing one or more specific flash memory commands;

interpret data received in a second write cycle as a number N of subsequent write cycles to be stored as a sequence of specific flash memory commands;

receive and store the N subsequent write cycles in a buffer; and execute the N specific flash memory commands stored in the buffer upon receiving a final write cycle that can be interpreted as a confirmation command.

14. The computer program product of claim 13, further comprising instructions operable to cause the programmable microcontroller to output an error message and erase the N specific flash memory commands stored in the buffer upon receiving a final write cycle that cannot be interpreted as a confirmation command.

15. The computer program product of claim 13, further comprising instructions operable to cause the programmable microcontroller to output an error message and ignore the N specific flash memory commands stored in the buffer upon receiving a final write cycle that cannot be interpreted as a confirmation command.

16. The computer program product of claim 13, further comprising instructions operable to cause the programmable microcontroller to output an error message when the number of write cycles N interpreted in the second write cycle is larger than the number of flash memory commands that can be stored in the buffer.

17. The computer program product of claim 13, further comprising instructions operable to cause the programmable microcontroller to interpret a received write cycle as a programmably updateable flash memory command.

18. A flash memory device comprising:

a buffer, and a state machine coupled to the buffer and configured to respond to a first write cycle representing a command by (a) storing as data in the buffer one or more subsequent write cycles up to a final write cycle representing a confirmation of the first write cycle command and (b) executing the data stored in the buffer as one or more flash memory commands.

* * * * *